(12) United States Patent
McLane et al.

(10) Patent No.: US 9,088,626 B2
(45) Date of Patent: Jul. 21, 2015

(54) INTERACTIVE EVENT CAST TO MULTIPLE MOBILE DEVICES

(71) Applicants: Daniel Perrine McLane, Bell Canyon, CA (US); Robert A. Bianchi, Granada Hills, CA (US)

(72) Inventors: Daniel Perrine McLane, Bell Canyon, CA (US); Robert A. Bianchi, Granada Hills, CA (US)

(73) Assignee: CHIRP INC., Woodland Hills, CA (US)

( * ) Notice: Subject to any disclaimer, the term of this patent is extended or adjusted under 35 U.S.C. 154(b) by 267 days.

(21) Appl. No.: 13/633,758

(22) Filed: Oct. 2, 2012

(65) Prior Publication Data

US 2014/0095657 A1    Apr. 3, 2014

(51) Int. Cl.

| | |
|---|---|
| H04L 29/08 | (2006.01) |
| G06F 15/16 | (2006.01) |
| H03M 13/03 | (2006.01) |
| H03M 13/05 | (2006.01) |
| H04N 21/258 | (2011.01) |
| H04N 21/2662 | (2011.01) |
| H04N 21/414 | (2011.01) |
| H04N 21/442 | (2011.01) |
| H04N 21/6405 | (2011.01) |
| H04N 21/658 | (2011.01) |

(52) U.S. Cl.
CPC .............. *H04L 67/322* (2013.01); *G06F 15/16* (2013.01); *H03M 13/03* (2013.01); *H03M 13/05* (2013.01); *H04L 67/32* (2013.01); *H04N 21/25825* (2013.01); *H04N 21/25833* (2013.01); *H04N 21/2662* (2013.01); *H04N 21/41407* (2013.01); *H04N 21/44227* (2013.01); *H04N 21/6405* (2013.01); *H04N 21/6582* (2013.01)

(58) Field of Classification Search
CPC ...... H03M 13/05; H03M 13/03; H04L 67/32; H04L 67/322; G06F 15/16; H04N 21/25825; H04N 21/25833; H04N 21/2662; H04N 21/41407; H04N 21/44227; H04N 21/6405; H04N 21/6582
USPC ........................................................ 709/217
See application file for complete search history.

(56) References Cited

U.S. PATENT DOCUMENTS

| 2006/0149813 | A1* | 7/2006 | Janik | ............................. 709/203 |
| 2009/0298490 | A9* | 12/2009 | Janik | ............................. 455/419 |

* cited by examiner

*Primary Examiner* — Michael C Lai
(74) *Attorney, Agent, or Firm* — Brooks Acordia IP Law, PC; Pejman Yedidsion

(57) ABSTRACT

Systems and devices for, and methods of, interactive event casting, by: (a) scheduling a plurality of transactions, where the scheduling may be based on passing a system time and a channel usage schedule; (b) aggregating the plurality of transactions, where the aggregating results in minimizing data transfer traffic; (c) executing a data compression scheme, where the data compression scheme may be based on dynamically changing bitrate of a video data stream accordingly to local access point data traffic; and (d) initiating an application, where the initiated application decompresses the received video data stream, and where the decompressed video data stream may be spooled.

13 Claims, 6 Drawing Sheets

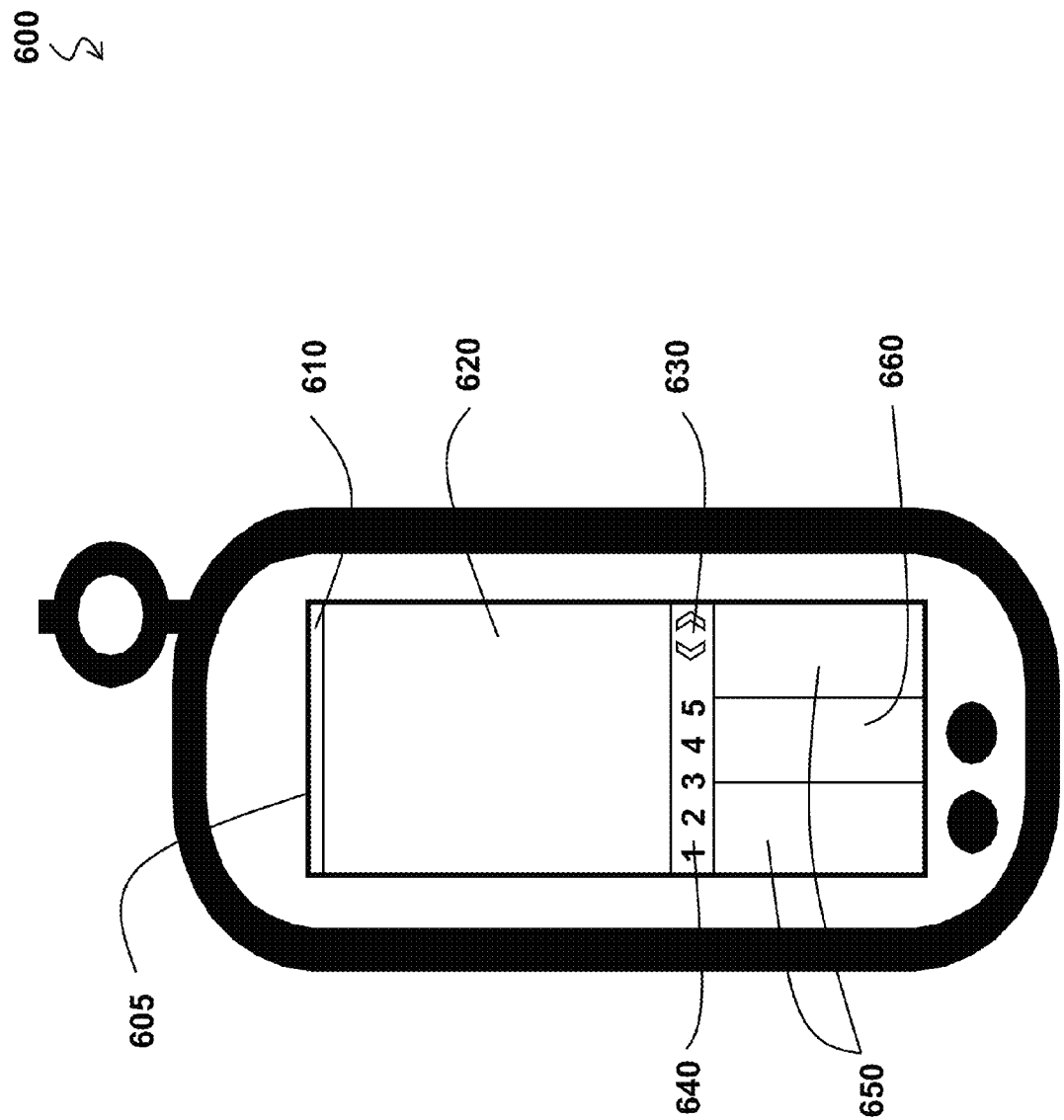

INTERACTIVE EVENT CAST TO MULTIPLE MOBILE DEVICES

BACKGROUND

Interactive features such as social media, games, security, and site services may be accessed through mobile phones or devices. Standards may define one or more specifications and features for mobile networks, systems, and devices. Presently, mobile, i.e., portable and wireless, devices are readily available and universally used, especially where a large group of people are attending the same event. Accordingly, since the popularity of such devices has increased so dramatically, managing large numbers of mobile devices in an environment where a large group of people are gathered in one place may be desirable.

SUMMARY

Embodiments include methods, systems, and devices where, for example, a method embodiment may include the steps of: (a) scheduling, by a networked computing device, a plurality of transactions associated with a first computing device, wherein the scheduling is based on passing to the first computing device a system time and a channel usage schedule; (b) aggregating, by the networked computing device, the plurality of transactions associated with the first computing device, where the aggregating results in minimizing data transfer traffic between the networked computing device and the first computing device; (c) executing, by the networked computing device, a data compression scheme associated with the first computing device, wherein the data compression scheme may be based on dynamically changing bitrate of a video data stream accordingly to local access point data traffic; and (d) initiating, by the first computing device, an application, where the initiated application decompresses the received video data stream, and where the decompressed video data stream may be spooled in a memory location of the first computing device. Optionally, the networked computing device may be external to the first computing device behind a network firewall. In some embodiments the first computing device may be a mobile device. In other embodiments the networked computing device may be a server computing device. Additionally, the mobile device may comprise a web application hosting platform.

Embodiments include methods, systems, and devices where, for example, a networked computing device embodiment may include: a processor and addressable memory comprising a set of one or more applications, where the processor may be configured to: schedule a plurality of transactions associated with a first computing device, where the schedule may be based on passing to the first computing device a system time and a channel usage schedule; aggregate the plurality of transactions associated with the first computing device, where the aggregation results in minimizing data transfer traffic between the networked computing device and the first computing device; and execute a data compression scheme associated with the first computing device, where the data compression scheme may be based on a dynamic change in bitrate of a video data stream based on local access point data traffic. Optionally, the networked computing device may be external to the first computing device disposed behind a network firewall. In some embodiments, the first computing device may be a mobile device. In other embodiments, the mobile device comprises a web application hosting platform.

Other embodiments include methods, systems, and devices where, for example a system embodiment may include: (a) a first computing device, operably coupled to a networked computing device via a communication medium, the networked computing device comprising: (i) a memory and a processor configured to: (1) communicate simultaneously from the first computing device to a plurality of network computing devices using multi-cast and uni-cast messages; (2) schedule a plurality of transactions associated with the first computing device, where the schedule may be based on passing to the first computing device a system time and a channel usage schedule; (3) aggregate the plurality of transactions associated with the first computing device, where the aggregation results in minimizing data transfer traffic between the networked computing device and the first computing device; (4) execute a data compression scheme associated with the first computing device, where the data compression scheme may be based on a dynamic change in bitrate of a video data stream based on local access point data traffic; and (5) send to the first computing device the compressed video data stream based on the scheduled transactions and aggregated transactions; and (b) the first computing device comprising: a processor, where the processor may be configured to: initiate an application, where the initiated application decompresses the received compressed video data stream, and where the decompressed video data stream may be spooled in a memory location of the first computing device.

BRIEF DESCRIPTION OF THE DRAWINGS

Embodiments are illustrated by way of example and not limitation in the figures of the accompanying drawings, and in which:

FIG. 6 illustrates an exemplary mobile device.

DETAILED DESCRIPTION

The embodiments of the present invention relate to techniques for bandwidth use control, variable bit rate video compression, and transaction optimization, particularly those used to minimize cost and complexity of wireless network systems. The embodiments of the present invention may apply to broadcast networks, wired or wireless, and to specifications or standards, including those that may later be developed. In one embodiment, an interactive, live broadcast may be streamed to mobile devices using wireless local area network (WLAN) products that may be based on the Institute of Electrical and Electronics Engineers' (IEEE) 802.11 standards, for example, wireless WiFi™. The mobile devices may act as a video display and recorder, showing for example, multiple camera views, game and event information, trivia, and promotions under control of the user. Devices that may use WLAN, for example, mobile phones, specifically smartphones, personal computers, video game consoles, tablets, and/or digital audio players, may connect to a network resource such as the Internet via a wireless network access point. In one embodiment, the system may manage large numbers of mobile devices in a crowd environment, via for example, bandwidth use control, variable bit rate video compression, and transaction optimization, thereby minimizing cost and complexity of the system.

Figure 1:
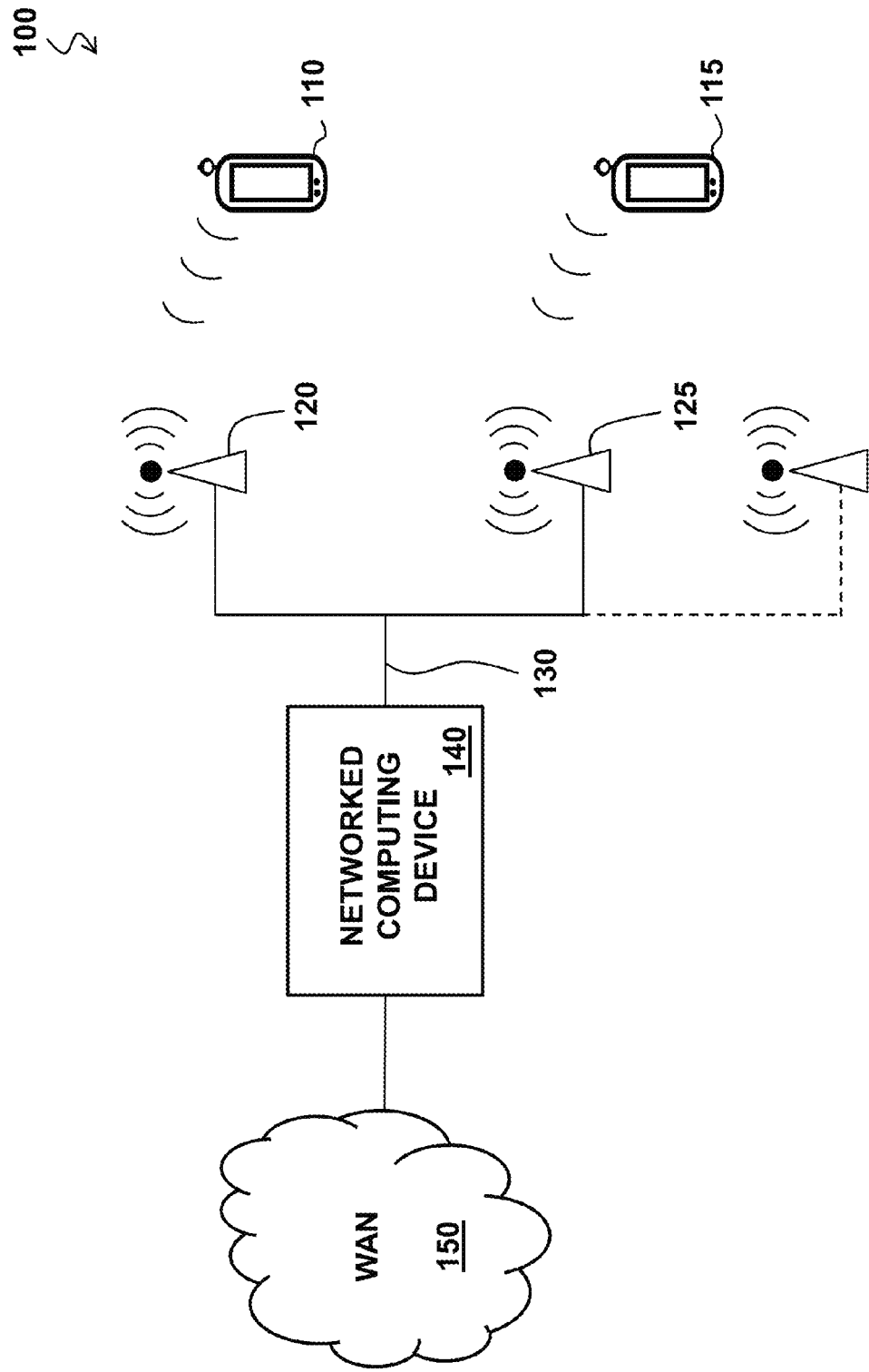
FIG. 1 depicts an embodiment of a computing system that includes user equipment, a plurality of wireless local area network devices, a networked computing device, and a Wide Area Network.

FIG. 1 depicts an exemplary embodiment of a computing system 100 that includes a first user equipment (UE), e.g., a mobile device 110 and a second UE, e.g., a mobile device 115, a plurality of wireless local area network devices (WLANs) 120,125, a networked computing device 140, and a Wide Area Network (WAN) 150 that may provide access to the Internet or other content sources. In some embodiments, for example, a connection 130 may be established between the WLANs 120,125 and the networked computing device 140. In some embodiments, the networked computing device 140 may be connected to the WAN 150 and may have access to the World Wide Web. The networked computing device 140 may be operably coupled to the WAN network 150 and may communicate with each other via various means, including, for example, via wired or wireless network segments, such as radio frequency, infrared, and/or microwave. In some embodiments various protocols and programming languages may also be used, such as transmission control protocol (TCP) over Internet Protocol (IP)—TCP/IP, User Datagram Protocol (UDP) with multi-cast data communication plans, hypertext transfer protocol (HTTP) with hypertext markup language (HTML), simple object access protocol (SOAP) with extensible markup language (XML), and other communication means adapted to operably connect the networked computing device 140 with the other devices within the computing system 100.

In one embodiment, the mobile devices 110,115 may execute a set of one or more applications via an operating system (OS) that may be running on the device. The application set may be limited in functionality, e.g., limited access to memory and to operating system services, according to a set of rules; rules which may be defined per application, per set of applications, or per device. The set of applications may be executed in an environment where data that may include streaming data, for example, videos, that may be transmitted to and received by a computing device. The computing system 100 may broadcast live video streams over the WLANs 120,125 along with other non-streaming content. In one embodiment, the software application running on the devices 110,115 may include a capability to display multiple live video streams, other entertainment and informational content such as event information, venue information, and advertisements. The exemplary devices 110,115 may decompress the video and spool the video stream in the device's memory so that a video recorder functionality may be provided, thereby allowing the user to rewind, enable slow motion, and fast forward through the video. The application may further provide a convenient user interface to view the video streams, other content such as game and venue information, interactive games, and social media connection to services such as Twitter and Facebook.

In one exemplary computing system where multiple access points may be connected to the user mobile devices 110,115, the system may run IEEE 802.11 protocol for WiFi™, although other standards may also be used. In one embodiment, each access point may have several radio elements that communicate with the mobile devices. The WiFi™ may be used in multi-cast and unicast modes to deliver the video streams and interactive content. In an exemplary embodiment where the computing system 100 is implemented in a dense crowd environment, the computing system 100 may minimize the data traffic and transactions with each device, for example, mobile devices 110,115, using compression and link management methods so that cost is minimized and Quality of Service (QoS) is acceptable. In one embodiment, the video content may be compressed using a wavelet transform technique that allows for a trade-off between image quality and bandwidth usage. Optionally, compression techniques may be used in various applications, such as, but not limited to, image processors, analog-to-digital converters, coders, e.g., encoder and/or decoders, buffer storage, and streaming data transmission. In one embodiment, the link may also implement scheduling and "push-pull" techniques to optimize traffic. This technique may aggregate transactions with the UE to minimize overhead associated with transactions. Push techniques may be used to provide an "always-on" capability, in which new messages may be actively transferred, i.e., pushed, as they arrive to a client device, for example, mobile devices and smartphones.

Figure 2:
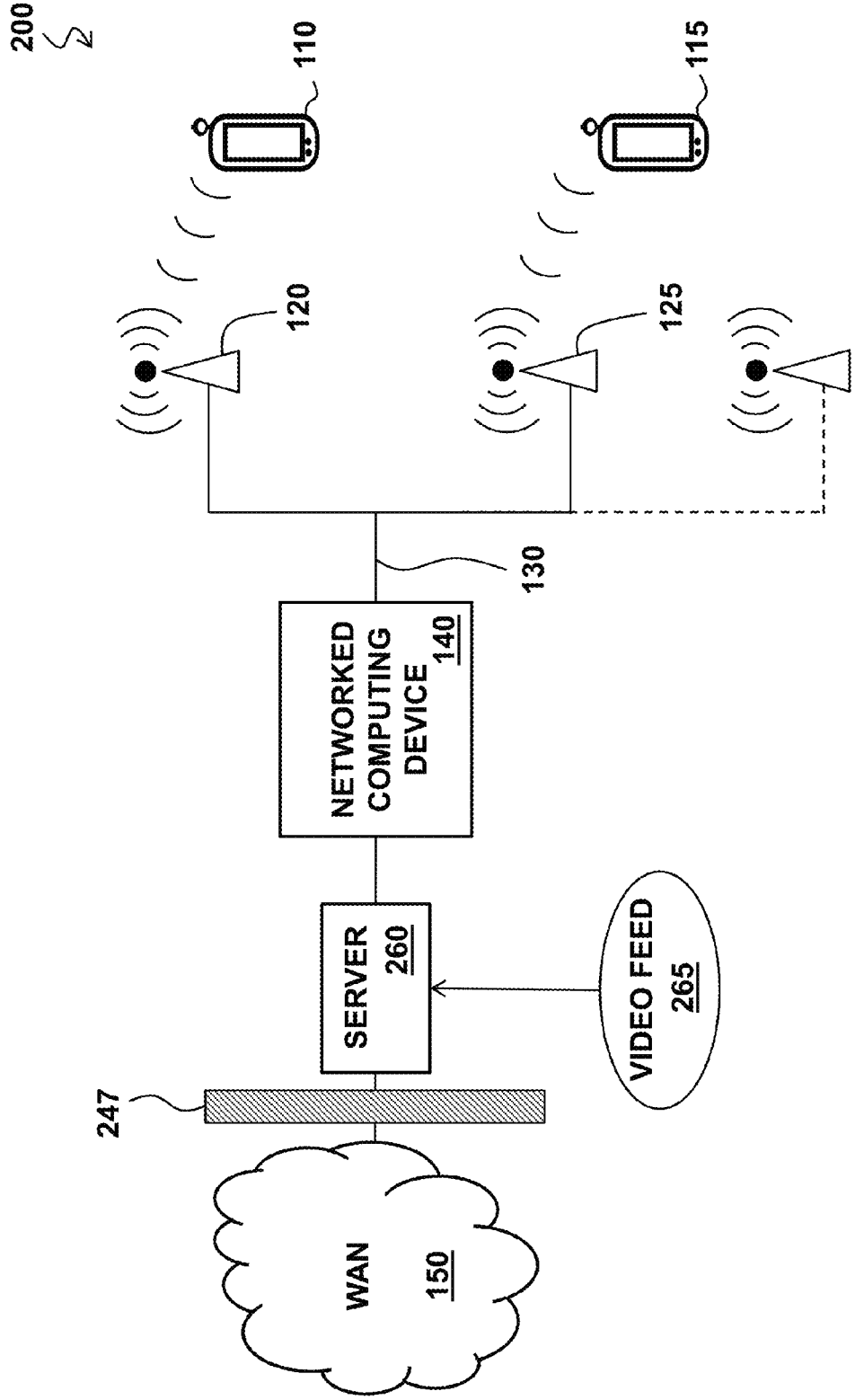
FIG. 2 depicts an exemplary embodiment of a computing system of FIG. 1, further showing a server and firewall.

FIG. 2 depicts an exemplary embodiment of a computing system 200 that includes mobile devices 110,115, a plurality of WLAN devices 120,125, a networked computing device 140, and a WAN 150 that may provide access to the Internet, where a server 260 may be operably connected to the networked computing device 140 and the WAN 150. In one embodiment, the server 260 may be connected to the WAN 150 where the WAN 150 may be external to the networked computing device 140 and behind a network firewall 247. In the exemplary embodiments where the WAN 150 is behind a network firewall, the server 260 may implement a method to access the WAN 150. In one embodiment, the server 260 may receive a video feed 265. In some embodiments network connection and support equipment may integrate the system with the Local Area Network (LAN), e.g., the LAN at a venue, and the WAN. Optionally, a server configured to enable streaming output to be transmitted to a receiving device, e.g., UE with a decoder, may be implemented.

The computing system of FIG. 2 may also comprise a set of one or more servers that may provide overall system management and control. Management functions may include: traffic monitoring for system balancing, use metrics for billing, health monitoring, and usage rules enforcement. System balancing involves spatial distribution of the mobile devices across the available access points and channels to balance loading and provide fault tolerance in case of failure in the system. This includes segregation of devices into appropriate RF bands, e.g., 2.4 GHz and 5 GHz bands, as well as channel assignments. Optionally, roaming controls and management may also be implemented. In some embodiment, the devices with unsupported or limited capabilities, such as older slower devices, may be denied access. Use metrics may include time connected, data use, and QoS metrics for dropped packets, signal strength, and other indicators. Usage rules may include enforcement of access policies to outside content, data use limits, and anomalous behavior containment.

In an exemplary embodiment where the system produces the content, the content production function may be responsible for broadcast editing, advertisement insertion, and content creation. In this example, equipment used for video production may include workstations with video editing software supported by network area storage (NAS). Some events may have rules concerning the content shown at the event, for example, controversial calls at a game and advertising restrictions, and accordingly, these rules may be enforced. The computing device, along with other support equipment, may be integrated with a Local Area Network (LAN) and the Wide Area Network (WAN) at a venue, via network connections. Some of the support equipment may include: routers, hubs, and firewalls.

Mobile Device Management Equipment

Figure 3:
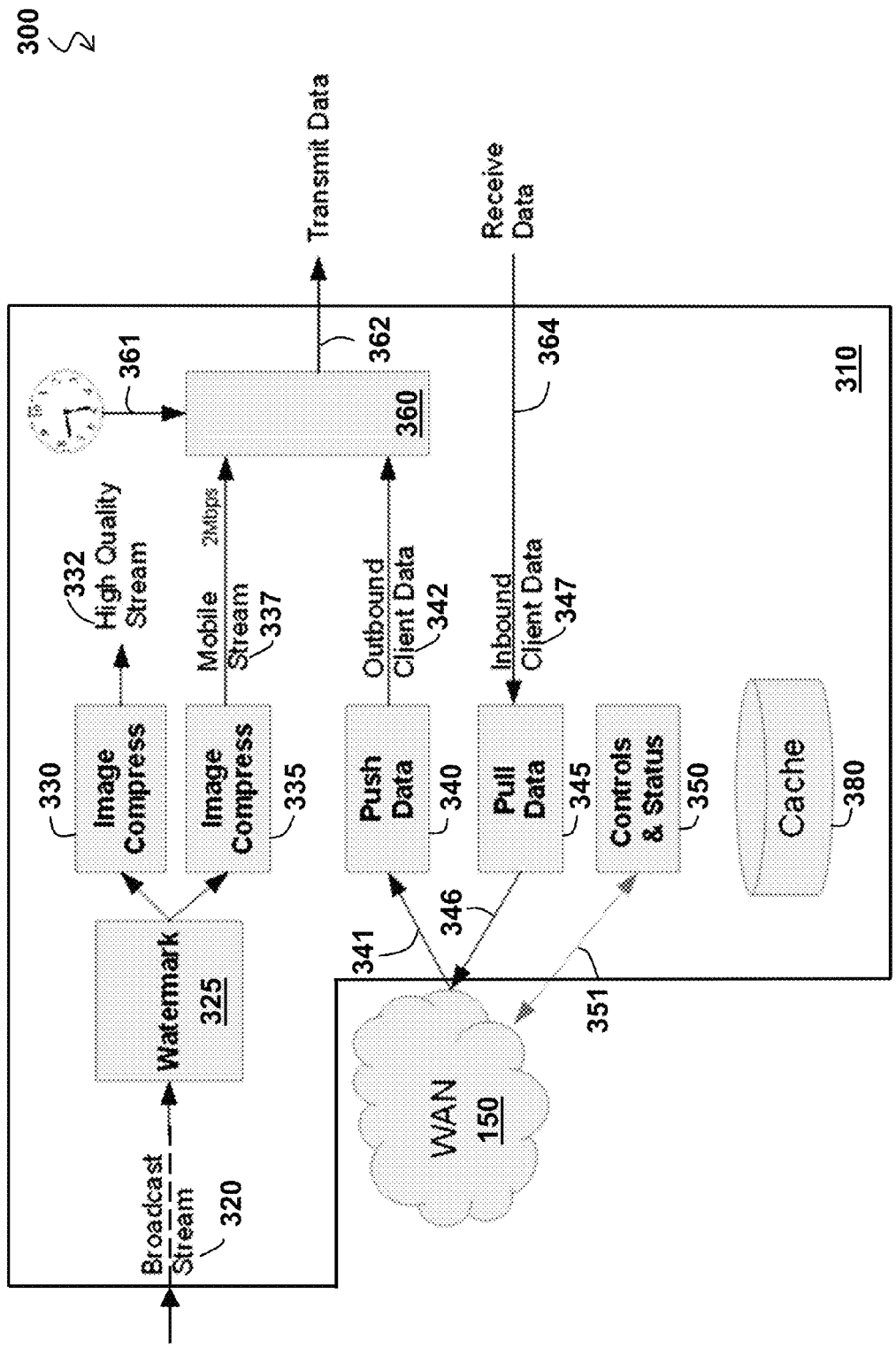
FIG. 3 illustrates an exemplary top level functional block diagram of an embodiment of a mobile device management equipment system.

FIG. 3 illustrates an exemplary mobile device management equipment system embodiment 300 where a computing device 310 may be connected via a set of network links 341,346,351 to a WAN 150. The computing device 310 may be linked to a WLAN via network links 362,364. Accordingly, the computing device may be in operable communication via communication mediums, e.g., such as a local area network or the Internet. The network links 341,346,351 may comprise multiple links, and may include wireless communication links, wired, and/or fiber optic communication links. The computing device 310 may receive a broadcast stream 320, where the broadcast stream comprises a set of one or more sequence of digitally encoded consistent signals, i.e., data packets. The broadcast stream 320 may be used to transmit or receive information that is in the process of being transmitted and may further be processed by a watermark system 325. In some embodiments the watermarking system 325 may embed, via an algorithm, a watermark in the received data, e.g., broadcast stream, and produce a watermarked signal or data stream. In one exemplary embodiment, a watermark may be stored in a data file and may refer to a method for ensuring data integrity. The data stream may be compressed via an image compressor 330,335 and generate either a high quality stream 332 or lower bit rate and lower quality stream for UE, referred to as mobile stream 337. The computing device 310 may then send the mobile stream to a scheduler 360 and based on a time-slot method that may seek to minimize data collisions on the wireless channel associated with transaction on each mobile device. The scheduler 360 may also receive a set of outbound client data 342 and based on the mobile stream 337, outbound client data 342, and time slot data 361 initiate transmission of one or more data streams—e.g., data to be transmitted to the mobile device.

In some embodiments, the computing device 310 may further comprise a push mobile data device management 340, a pull mobile data device management 345, and a device management for controls and status 350. In one embodiment, the push mobile data device management 340 and the pull mobile data device management 345 may aggregate transactions with a mobile device to minimize traffic. A cache 380 may also be used to cache data being transmitted and/or collect data, duplicating original values stored elsewhere on the device. The computing device 310 may also receive data from a mobile device where the data may be inbound client data 347 received by the pull mobile data device management 345.

The data communication may use multi-cast video and event information using UDP. The data communication may further use time-slice individual data. In some embodiments, the QoS Priority may be determined based on: (1) video, (2) inbound client data, and (3) all other subject to traffic policies. In one exemplary embodiment, the push data aggregation may be implemented via TCP/IP protocols and the time sync updates may be for time-slice control. Each mobile device may comprise an embedded web application server that may allow executable applications or scripts, e.g., application software, that may be available in versions for different platforms and are to be executed on the mobile device. Applications may be developed to support various mobile devices and their respective operating systems such as: iOS, Android, and Windows. In some embodiments, the application may include a capability to display single or multiple live video streams, entertainment and informational content such as event and venue information, and advertisements. The video streams may be compressed data, requiring the application to decompress and then display the images. The application may spool the video so that the user may have control of the video viewing to rewind, fast forward, and view slow motion. Optionally, interactive features for social media such as Twitter and Facebook may be provided. Other features include: text alerts to event security and interactive games. In an exemplary embodiment, various types of advertisements may be integrated into the broadcast that may include: banner, interstitial, and video roadblocks (full screen video advertisements). The application may also send user data back to the server to capture customer information, monitor QoS, and other diagnostic information. In this exemplary embodiment, the application is downloaded to the mobile device prior to use.

Figure 4:
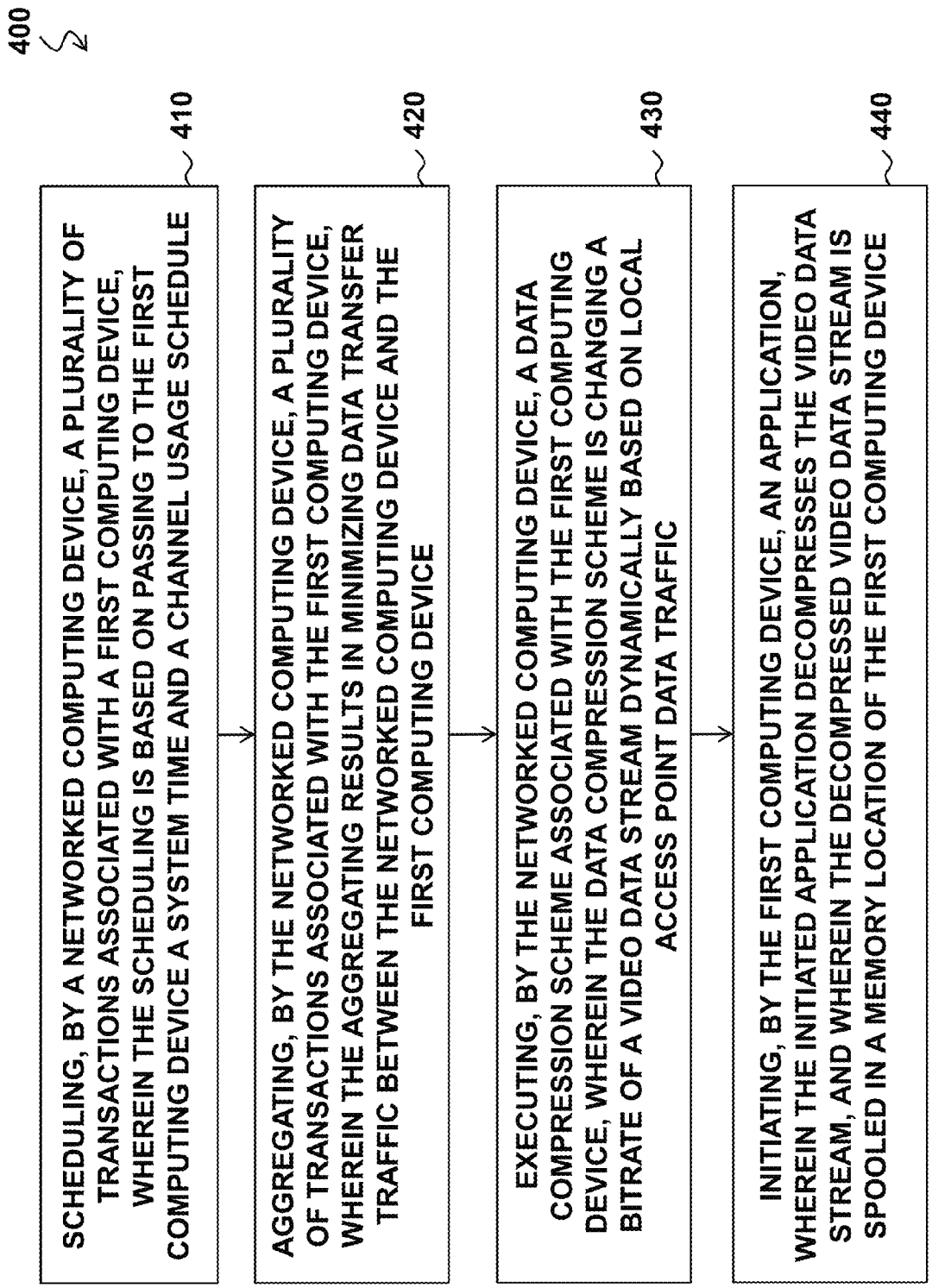
FIG. 4 is a flowchart of an exemplary process.

FIG. 4 is an exemplary flowchart depicting an exemplary process of the mobile device management equipment system 400, comprising the steps of: scheduling, by a networked computing device, a plurality of transactions associated with a first computing device, where the scheduling is based on passing to the first computing device a system time and a channel usage schedule (step 410); aggregating, by the networked computing device, the plurality of transactions associated with the first computing device, where the aggregating results in minimizing data transfer traffic between the networked computing device and the first computing device (step 420); executing, by the networked computing device, a data compression scheme associated with the first computing device, where the data compression scheme is based on dynamically changing bitrate of a video data stream accordingly to local access point data traffic (step 430); and initiating, by the first computing device, an application, where the initiated application decompresses the received video data stream, and where the decompressed video data stream is spooled in a memory location of the first computing device (step 440).

In one embodiment, mobile device management equipment may communicate with multiple access points to form a cluster. Each cluster may comprise many access points, where each cluster may be communicating to many mobile devices. The mobile device manager may implement controls to optimize the WiFi™ connections. These controls to optimize the WiFi™ connections may include, for example, network port controls, access privileges, and radio (channel) assignment. Other responsibilities of the mobile management equipment are: data compression, traffic management, shaping per client device, security, use metering, and content filtering. Data compression is implemented in the mobile device manager to minimize data transfer requirements and may provide more flexibility for the system configuration. The data compression may be dynamically changed to change the video stream bitrate according to local access point data traffic. For example, if an access point has a large number of users then the compression may be increased to reduce bitrate and serve more users at the expense of video quality. One exemplary feature is "push-pull" mobile device management that aggregates transactions with a mobile device to minimize traffic. This feature minimizes multiple transactions to one device that consume excessive bandwidth as compared to a single, consolidated transaction. The system may schedule transactions according to a time-slot method that seeks to minimize data collisions on the wireless channel. In one embodiment, the system time may be passed to each mobile device along with a channel usage schedule.

Figure 5:
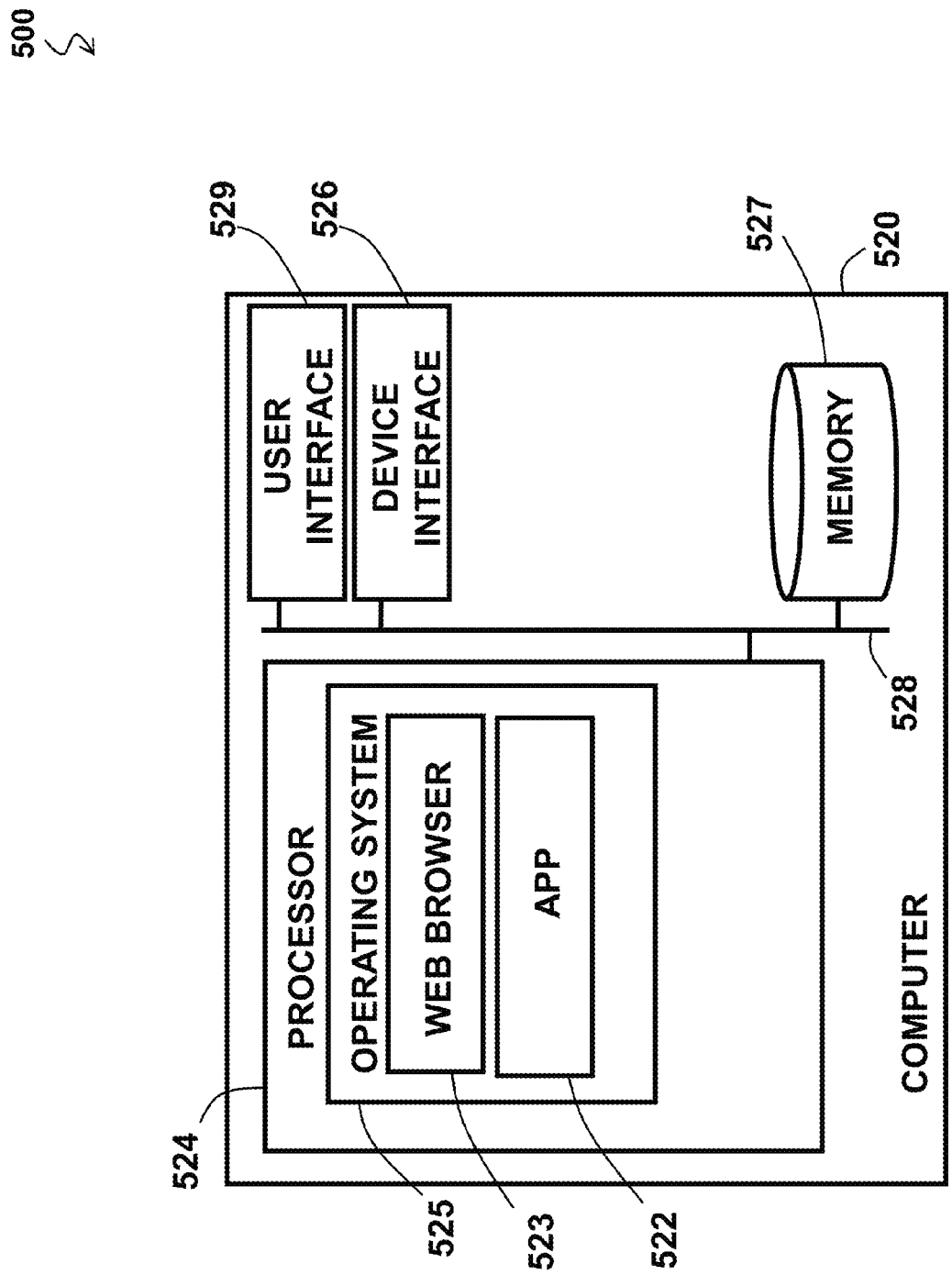
FIG. 5 depicts an exemplary embodiment of computing device.

FIG. 5 illustrates an exemplary top level functional block diagram of a computing device embodiment 500. The exemplary operating environment is shown as a computing device 520 comprising a processor 524, such as a central processing unit (CPU), addressable memory 527, an external device interface 526, e.g., an optional universal serial bus port and related processing, and/or an Ethernet port and related processing, and an optional user interface 529, e.g., an array of status lights and one or more toggle switches, and/or a display, and/or a keyboard and/or a pointer-mouse system and/or a touch screen. Optionally, the addressable memory may, for example, be: flash memory, EPROM, and/or a disk drive or other hard drive. These elements may be in communication with one another via a data bus 528 via an operating system 525 such as one supporting a web browser 523 and applications 522, the processor 524 may be configured to execute steps of a process establishing a communication channel according to the exemplary embodiments described above.

FIG. 6 illustrates an exemplary mobile device embodiment 600. The exemplary mobile device is shown as displaying an application streaming data from a networked computing device. The mobile device display 605 may comprise a top portion 610 for displaying phone information, e.g., phone carrier, phone signal, time, battery life remaining, use of WiFi™, use of Bluetooth, and/or push notifications. The application may comprise a visual display portion 620. The visual display portion 620 may include text, images, and/or video streamed from a networked computing device, e.g., a video clip of a sports game. The text, image and/or video clip to be played may be indicated by one or more user-selectable icons 640, e.g., the numbers 1, 2, 3, etc. In some embodiments, the text, image and/or video clips may be selected with one or more toggle icons 630 to move to the next selection or to move to a previous selection. The application may also comprise areas for further text, image, and/or video data 650 that may correspond to what may be currently active on the visual display portion 620. In some embodiments, there may be a placeholder portion 660 to display static or varying information, e.g., one or more logos, other branding information, and/or advertisements. In another exemplary embodiment, the mobile application may implement full screen video display that is selected by touch screen motion of two finger touches moving apart while in the video area. Additionally, a reverse motion converts back to normal size video. The screen may also resize and reconfigure for horizontal position of the device, preserving the content. In one embodiment, the mobile device 600 may interact with the host managed using a time scheduling method in the application that coordinates transfers with the host to minimize collisions. This is not common in WiFi™, which is usually just opportunistic in its use of the communications channel.

In an embodiment where the computing system hosts a networked computing device, the networked computing device may transfer down a system time and schedule to the mobile device which indicates the time when the mobile device should transmit. The video program may also be content protected to prevent unauthorized duplication and where all content is erased when the application is closed. In some embodiment, the computing system may also integrate a text message system to allow a user, e.g., the fan, to alert event security to problems. The computing system may record the locale of the device and device ID for records. This augments event security to improve fan safety. In one exemplary embodiment, teams and events may choose to have custom graphics consistent with their team branding since the application interface is customizable to change the applicant's appearance and feature set as desired.

It is contemplated that various combinations and/or sub-combinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further it is intended that the scope of the present invention is herein disclosed by way of examples and should not be limited by the particular disclosed embodiments described above.

What is claimed is:

1. A method comprising:
scheduling, by a networked computing device, a plurality of transactions for transmission, the plurality of transactions associated with a first computing device, wherein the scheduling is based on passing to the first computing device a system time and a channel usage schedule, wherein the channel usage schedule determines scheduled usage of a communication channel between the first computing device and the networked computing device; and wherein the scheduling is according to a time-slot method that is based on the system time and the channel usage schedule;
aggregating, by the networked computing device, the plurality of transactions associated with the first computing device for delivery according to the channel usage schedule, wherein the aggregating results in minimizing data transfer traffic between the networked computing device and the first computing device;
executing, by the networked computing device, a data compression scheme on a video data stream associated with the first computing device, wherein the data compression scheme is based on dynamically changing bitrate of the video data stream according to local access point data traffic;
transmitting, by the networked computing device, the compressed video data stream to the first computing device based on the scheduled plurality of transactions and the aggregated plurality of transactions; and
initiating, by the first computing device, an application, wherein the initiated application decompresses the received compressed video data stream from the networked computing device, and wherein the decompressed video data stream is spooled in a memory location of the first computing device.

2. The method of claim 1 wherein the networked computing device is external to the first computing device behind a network firewall.

3. The method of claim 1 wherein the first computing device is a mobile device.

4. The method of claim 3 wherein the networked computing device is a server computing device.

5. The method of claim 3 wherein the mobile device initiates an application wherein the application is initiated on a web application hosting platform.

6. The method of claim 3 further comprising:
communicating simultaneously from the first computing device to a plurality of network computing devices using multi-cast and uni-cast messages.

7. The method of claim 1, wherein aggregating, by the networked computing device, the plurality of transactions associated with the first computing device for delivery according to the channel usage schedule is based on a delivery priority that has been assigned.

8. The method of claim 1, wherein, aggregating, by the networked computing device, the plurality of transactions associated with the first computing device for delivery according to the channel usage schedule minimizes data collisions on the communication channel associated with transaction on the first computing device.

9. A networked computing device comprising:
a processor and addressable memory comprising a set of one or more applications, wherein the processor is configured to:
- schedule for transmission a plurality of transactions associated with a first computing device, wherein the schedule is based on passing to the first computing device a system time and a channel usage schedule, wherein the channel usage schedule determines scheduled usage of a communication channel between the first computing device and the networked computing device; and wherein the scheduling is according to a time-slot method that is based on the system time and the channel usage schedule;
- aggregate the plurality of transactions associated with the first computing device for delivery according to the channel usage schedule, wherein the aggregation results in minimizing data transfer traffic between the networked computing device and the first computing device;
- execute a data compression scheme on a video data stream associated with the first computing device, wherein the data compression scheme is based on a dynamic change in bitrate of a video data stream according to local access point data traffic; and
- transmit the compressed video data stream to the first computing device to initiate an application, wherein the initiated application by the first computing device decompresses the received compressed video data stream, and wherein the networked computing device transmits the compressed video data stream based on the scheduled plurality of transactions and the aggregated plurality of transactions.

10. The networked computing device of claim 9 wherein the networked computing device is external to the first computing device disposed behind a network firewall.

11. The networked computing device of claim 9 wherein the first computing device is a mobile device.

12. The networked computing device of claim 11 wherein the mobile device initiates the application and wherein the application is initiated on a web application hosting platform.

13. A system comprising:
a first computing device, operably coupled to a networked computing device via a communication medium, the networked computing device comprising:
a memory and a processor configured to:
- communicate simultaneously from the first computing device to a plurality of network computing devices using multi-cast and uni-cast messages;
- schedule for transmission a plurality of transactions associated with the first computing device, wherein the schedule is based on passing to the first computing device a system time and a channel usage schedule, wherein the channel usage schedule determines scheduled usage of a communication channel between the first computing device and the networked computing device; and wherein the schedule is according to a time-slot method that is based on the system time and the channel usage schedule;
- aggregate the plurality of transactions associated with the first computing device for delivery according to the channel usage schedule, wherein the aggregation results in minimizing data transfer traffic between the networked computing device and the first computing device;
- execute a data compression scheme on a video data stream associated with the first computing device, wherein the data compression scheme is based on a dynamic change in bitrate of a video data stream according to local access point data traffic; and
- send to the first computing device the compressed video data stream based on the scheduled transactions and aggregated transactions; and the first computing device comprising:
a processor, wherein the processor is configured to:
- receive the compressed video data stream from the networked computing device; and
- initiate an application, wherein the initiated application decompresses the received compressed video data stream, and wherein the decompressed video data stream is spooled in a memory location of the first computing device.

* * * * *